United States Patent [19]
Aydelott

[11] Patent Number: 6,090,198
[45] Date of Patent: Jul. 18, 2000

[54] METHOD FOR REDUCING THERMAL SHOCK IN A SEED CRYSTAL DURING GROWTH OF A CRYSTALLINE INGOT

[75] Inventor: Richard M. Aydelott, Ridgefield, Wash.

[73] Assignee: SEH America, Inc., Vancouver, Wash.

[21] Appl. No.: 09/206,349

[22] Filed: Dec. 7, 1998

[51] Int. Cl.⁷ .................................................. C30B 15/20
[52] U.S. Cl. ................................................ 117/13; 117/20
[58] Field of Search ...................................... 117/13, 20

[56] References Cited

U.S. PATENT DOCUMENTS

| | | |
|---|---|---|
| 4,722,764 | 2/1988 | Herzer et al. .............................. 117/13 |
| 5,628,823 | 5/1997 | Chandrasekhar et al. . | |
| 5,919,303 | 7/1999 | Holder ..................................... 117/13 |

FOREIGN PATENT DOCUMENTS

| | | |
|---|---|---|
| 0 795 632 A1 | 9/1997 | European Pat. Off. . |
| 0 821 083 A1 | 1/1998 | European Pat. Off. . |

OTHER PUBLICATIONS

Takao Abe, *Innovated Silicon Crystal Growth and Wafering Technologies*, Electrochemical Society Proceedings, vol. 97–3, May 5–9, 1997, pp. 123–133.

V. V. Antonova et al., *Origin of Dislocation Subboundaries in NaCl Single Crystals Grown From the Melt*, Soviet Physics Solid State, vol. 10, No. 11, May 1969, pp. 2599–2602.

Lawrence D. Dyer, *Dislocation–Free Czochralski Growth of <110> Silicon Crystals*, Journal of Crystal Growth 47 (1979) pp. 533–540.

Shun–Ichi Tohno et al., *X–ray topographic observation of dislocation generation and propagation in InP single crystal grown by the liquid–encapsulated Czochralski technique*, J. Appl. Phys. 54 (2), Feb. 1983, pp. 666–672.

Susumu Kondo et al., *Low Dislocation Density GaSb Single Crystals Grown by LEC Technique*, Journal of Crystal Growth 56 (1982), pp. 39–44.

B. Cockayne et al., *Control of Dislocation Structures in LEC Single Crystal InP*, Journal of Crystal Growth 64 (1983), pp. 48–54.

G. Fraundorf et al., *The Effects of Thermal History During Growth on O Precipitation in Czochralski Silicon*, J. Electrochem. Soc.: Solid–State Science and Technology, Jul. 1985, pp. 1701–1704.

K. Yamada et al., *Elimination of Grown–In Dislocations in In–Doped Liquid Encapsulated Czochralski GaAs*, Journal of Crystal Growth 78 (1986), pp. 36–42.

(List continued on next page.)

*Primary Examiner*—Felisa Hiteshew
*Attorney, Agent, or Firm*—Alston & Bird LLP

[57] ABSTRACT

A method of growing a crystalline ingot, such as a dislocation free ("DF") crystalline ingot, is provided including the steps of providing a melt having an at least partially solidified surface. Next, a seed crystal is brought into contact with the solidified portion of the surface of the melt and the temperature of the seed crystal is permitted to stabilize. Once the temperature of the seed crystal has stabilized, the temperature of the melt is raised to completely liquify the melt. While the temperature of the melt is being raised, the seed crystal is maintained in contact with the melt thereby reducing thermal shock in the seed crystal by permitting the seed crystal to gradually warm with the liquidation of the melt. Once the melt is completely liquified, the seed crystal is withdrawn from the melt to thereby grow a DF crystalline ingot. Since the seed crystal remains relatively dislocation free due to the reduced temperature gradient between the seed crystal and the solidified portion of the surface of the melt, a DF crystalline ingot can be grown without a neck, or with a neck having a relatively large diameter and relatively short length, thereby enabling the growth of DF crystalline ingots having a larger diameter and a larger mass than grown with conventional CZ methods.

22 Claims, 16 Drawing Sheets

OTHER PUBLICATIONS

H. Kuwamoto et al., Dislocation Reduction in Large–Diameter LEC GaAs Growth, Journal of Crystal Growth 91 (1988), pp. 567–575.

L.A. Prokhorov et al., *Inheritance of seed dislocations by a single crystal,* Sov. Phys. Crystallogr. 34(5), Sep.–Oct. 1989, pp. 758–759.

Herng–Der Chiou et al., *The Stress and Strength at the Neck of a Large Diameter Silicon Crystal during Growth,* J. Electrochem. Soc., vol. 144, No. 8, Aug. 1997, pp. 2881–2886.

"Global Heat Transfer Model For Gzochealski Crystal Growth Based On Dissue–Gray Radiation"; Miyahara, et al; Journal of Crystal Growth 99 (1990) pp. 696–701.

METHOD FOR REDUCING THERMAL SHOCK IN A SEED CRYSTAL DURING GROWTH OF A CRYSTALLINE INGOT

FIELD OF THE INVENTION

The present invention relates generally to a method of growing crystalline ingots and more particularly, to a method for growing a substantially dislocation-free crystalline ingot which may have a large diameter neck.

BACKGROUND OF THE INVENTION

The monocrystalline silicon that is the starting material for many semiconductor electronic components is commonly prepared by a Czochralski ("CZ") process. In this process, pieces of polycrystalline silicon are placed in a crucible and melted to a liquidous state, thereby creating a melt. A seed crystal having the desired monocrystalline atomic structure is then lowered into contact with the molten silicon. As the seed crystal is slowly extracted from the melt, a monocrystalline ingot is drawn from the melt having the same atomic structure as the seed crystal.

Unfortunately, dislocation defects are generated in the seed crystal due to the thermal shock created as the seed crystal contacts the melt. Unless corrective actions are taken, the dislocation defects can propagate through and multiply in the growing crystal. As known to those skilled in the art, dislocations generally propagate along crystallographic planes. For a silicon seed crystal having a <100> orientation, the dislocations typically propagate along a plane that extends at an angle of 55° from the longitudinal axis of the crystal.

In order to terminate the dislocations prior to propagation through the main body of the crystalline ingot, crystals are typically grown with a neck section extending between the seed crystal and the main body of the crystal. The most common method of eliminating dislocations is known as the Dash method and involves growing a neck having a relatively small diameter and a relatively long length. For example, a neck grown according to the Dash method may have a diameter of between 2 mm and 4 mm and a length between 30 mm and 200 mm. As the neck is grown, the dislocations propagate through the neck toward the interface of the seed crystal and the melt. As a result of the extended length and small diameter of the neck, however, the dislocations terminate at the exterior surface of the neck such that the main body of the crystal is dislocation free ("DF"). The crystal is then expanded in diameter through the shoulder portion to the DF main body. Since there is no easy and reliable method to determine if the dislocations have been terminated, the Dash method generally requires the neck to have a relatively small diameter and an extended length in order to effectively terminate most, if not all, dislocations.

Although the Dash method is widely utilized, the Dash method has several significant disadvantages. For example, the time and expense associated with growing the neck section are non-recoverable since the neck is ultimately discarded as waste. Also, since the entire crystalline ingot is supported during growth by the relatively thin neck section, the maximum mass of a crystalline ingot is limited, typically to approximately 140 kg. Although this weight limit poses productivity and economic problems for crystalline ingots having conventional diameters of 150 mm or 200 mm, even more problems are created by this weight limit as the silicon industry begins to investigate and grow crystalline ingots having diameters of 300 mm or more.

Since it is a generally accepted premise within the industry that dislocations cannot be consistently removed from necks having diameters exceeding 10 mm, recent efforts have focused on other neck growing techniques to overcome the weight and productivity limitations. For example, U.S. Pat. No. 5,628,823 describes a method for growing a single crystalline ingot including a neck having an upper portion, an intermediate portion, and a lower portion. The upper portion has a diameter that tapers from the diameter of the seed crystal to the relatively constant diameter of the intermediate and lower portions. Although the majority of the intermediate and lower portions have diameters greater than 10 mm, dislocation generation is controlled by adjusting the pulling speeds such that even though the upper portion of the neck has dislocations, the lower portion is free of dislocations. Unfortunately, the neck grown according to U.S. Pat. No. 5,628,823 is relatively long, such as 165 mm, 200 mm or greater.

U.S. Pat. No. 5,126,113 describes an apparatus for supporting a single crystalline ingot during growth. Dislocations in the crystalline ingot are eliminated by growing a small diameter neck using the Dash method as described above. A large diameter bulge is then grown between the Dash neck and the conical section of the crystal body. In order to support the weight of the crystalline ingot during growth, the apparatus of U.S. Pat. No. 5,126,113 includes mechanical grips that engage the recessed lower surface of the bulge. Thus, this technique not only requires a Dash neck to be grown, but also requires a large diameter bulge to be grown for gripping by one or more mechanical grips, thereby complicating both the growth process and the pulling apparatus.

Finally, European Patent Application No. EP 0 795 632 discloses a method of manufacturing a seed crystal for use in a CZ crystal growth process in which the seed crystal is modified so as to define, for example, a hollow cylindrical void. The hollow cylindrical void opens through the lower end of the seed crystal that comes in contact with the melt. As described by EP 0 795 632, the cylindrical void assists in reducing the thermal shock by reducing the surface area that comes in contact with the melt. However, the creation of the hollow cylindrical void generally complicates the machining of the seed crystal.

Therefore, notwithstanding prior techniques to grow DF crystalline ingots, a need still exists for an improved technique for growing DF crystalline ingots. In particular, a need exists for improved techniques for growing relatively large and heavy DF crystalline ingots without subjecting the neck of the crystal to excessive stress and without repeatedly adjusting the pulling speed or requiring additional equipment for lifting or otherwise supporting the crystalline ingot during growth.

SUMMARY OF THE INVENTION

It is therefore one object of the present invention to provide a method of manufacturing a DF crystalline ingot that can have a relatively large diameter, such as 300 mm or greater, and a relatively large mass, such as 300 kg or greater.

It is another object of the present invention to reduce material waste and consequently, material costs associated with growing a crystalline ingot by the CZ method by growing a crystalline ingot that does not include a neck.

It is still another object of the present invention to improve the productivity of crystal growth according to the CZ method by allowing the growth of larger diameter crystalline ingots.

It is still another object of the present invention to improve the productivity of crystal growth according to the CZ method by significantly reducing the time and labor required to grow a neck between the seed crystal and main body of the crystalline ingot.

These and other objects are provided, according to the present invention, by a method of growing a crystalline ingot including the steps of providing a melt having an at least partially solidified surface. Next, a seed crystal is brought into contact with the solidified portion of the surface of the melt. Preferably, the temperature of the seed crystal is permitted to stabilize to a temperature near the temperature of the solidified portion of the surface of the melt.

Once the temperature of the seed crystal has stabilized, the temperature of the melt can be raised to liquify the solidified portion of the surface of the melt and, more typically, to completely liquify the melt. While the temperature of the melt is being raised, the seed crystal is maintained in contact with the melt thereby reducing thermal shock in the seed crystal by permitting the seed crystal to gradually warm with the liquidation of the melt. In a preferred embodiment, a portion of the seed crystal is inserted into the melt as the melt liquifies such that the inserted portion of the seed crystal melts. Advantageously, the portion of the seed crystal dipped into the melt contains substantially all the dislocations generated in the seed crystal.

Once the melt is completely liquified and the temperature of the seed crystal has stabilized, the seed crystal can then be withdrawn from the melt to thereby grow a DF crystalline ingot. Moreover, since the portion of the seed crystal remaining after dipping is relatively dislocation free, a DF crystalline ingot can be grown without the necessity of growing a relatively thin and relatively long neck. Indeed, a crystalline ingot grown according to the method of the present invention can be withdrawn from the melt with a neck having a relatively large diameter in comparison to that required using the conventional CZ method. By growing a crystalline ingot without a neck or alternatively, with a thicker and/or shorter neck, DF crystals having a larger diameter and a larger mass, such as crystalline ingots having a diameter of 300 mm or more and a mass exceeding 300 kg, can be grown according to the advantageous method of the present invention without requiring additional equipment to lift or otherwise support the crystal during growth.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
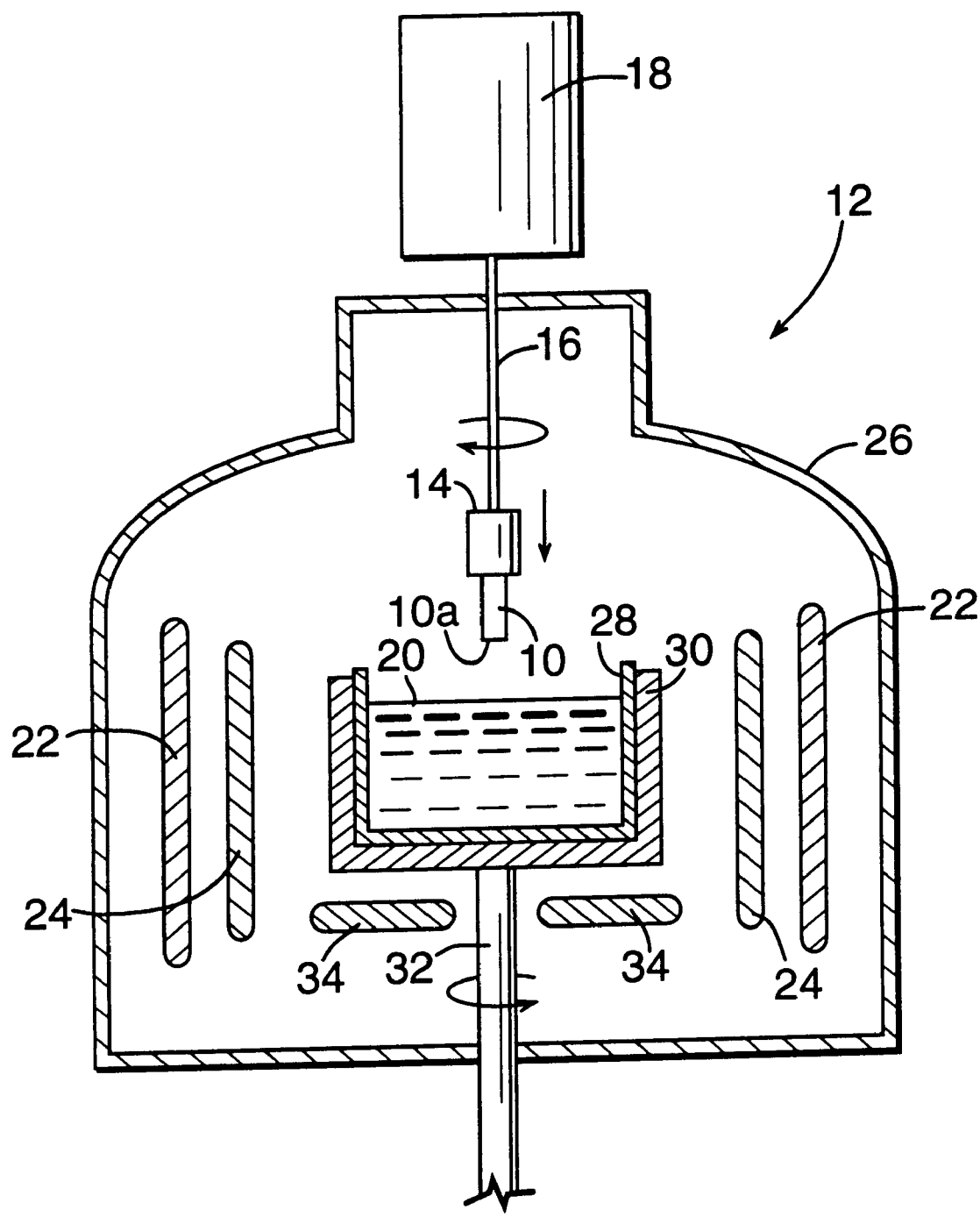
FIG. 1 is a schematic side view illustrating one embodiment of a CZ crystal growing apparatus that can implement the method of the present invention.

Referring to the drawings, and in particular to FIG. 1, there is shown a schematic of one embodiment of an apparatus 12 for growing crystalline ingots using the CZ method. During crystal growing operations, the seed crystal 10 is initially attached to a seed chuck 14 that securely holds the seed crystal throughout the growth process. For purposes of illustration and not limitation, a typical seed crystal can range from about 100 mm to 120 mm in length, and more preferably 110 mm in length, and have a cubic cross section of about 15 mm by 15 mm. The seed chuck is connected to a rotatable cable or shaft 16 attached to a mechanism 18 for lowering and raising the seed crystal relative to a melt 20, such as a molten bath of silicon. As known to those skilled in the art, the melt may include a predetermined percentage of dopant, if so desired. Among other components, the growing apparatus 12 typically includes a heat insulator 22 and a heater 24 disposed concentrically within a furnace body 26. A bottomed cylindrical quartz crucible 28 is typically received or nested within a graphite susceptor 30 that is fixed at the top end of a rotary shaft 32 that extends through the center of the furnace body. A second heater 34 may be positioned below the crucible and susceptor.

Figure 7A:
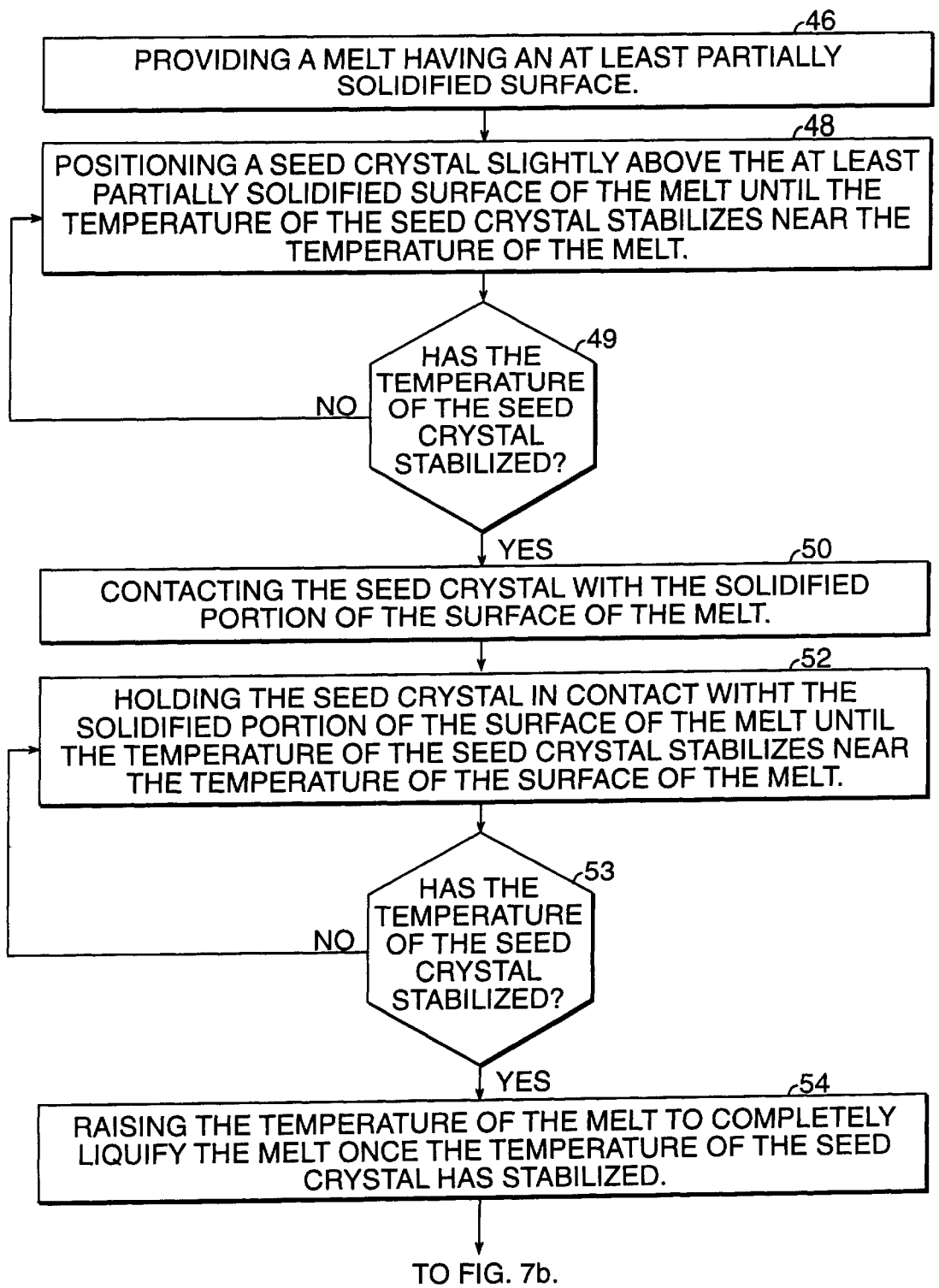
FIG. 7 is a flow chart illustrating operations performed during fabrication of a DF crystalline ingot according to one advantageous embodiment of the present invention.

As illustrated in FIG. 1 and described by block 48 of the flow chart of FIG. 7a, the seed crystal 10 is initially lowered to a position spaced from, but near the surface of the melt 20. The seed crystal is held in this position near the surface of the melt so that the seed crystal warms by thermal convection and radiation to a temperature near the temperature of the surface of the melt. Preferably, the seed crystal and the melt are rotated in opposite directions so that the seed crystal warms evenly. In one embodiment, the seed crystal is held approximately 10 mm above the surface of the melt. However, the seed crystal can be spaced by other distances from the melt so long as the seed crystal is warmed to a temperature near the temperature of the surface of the melt without departing from the spirit and scope of the present invention.

Figure 2:
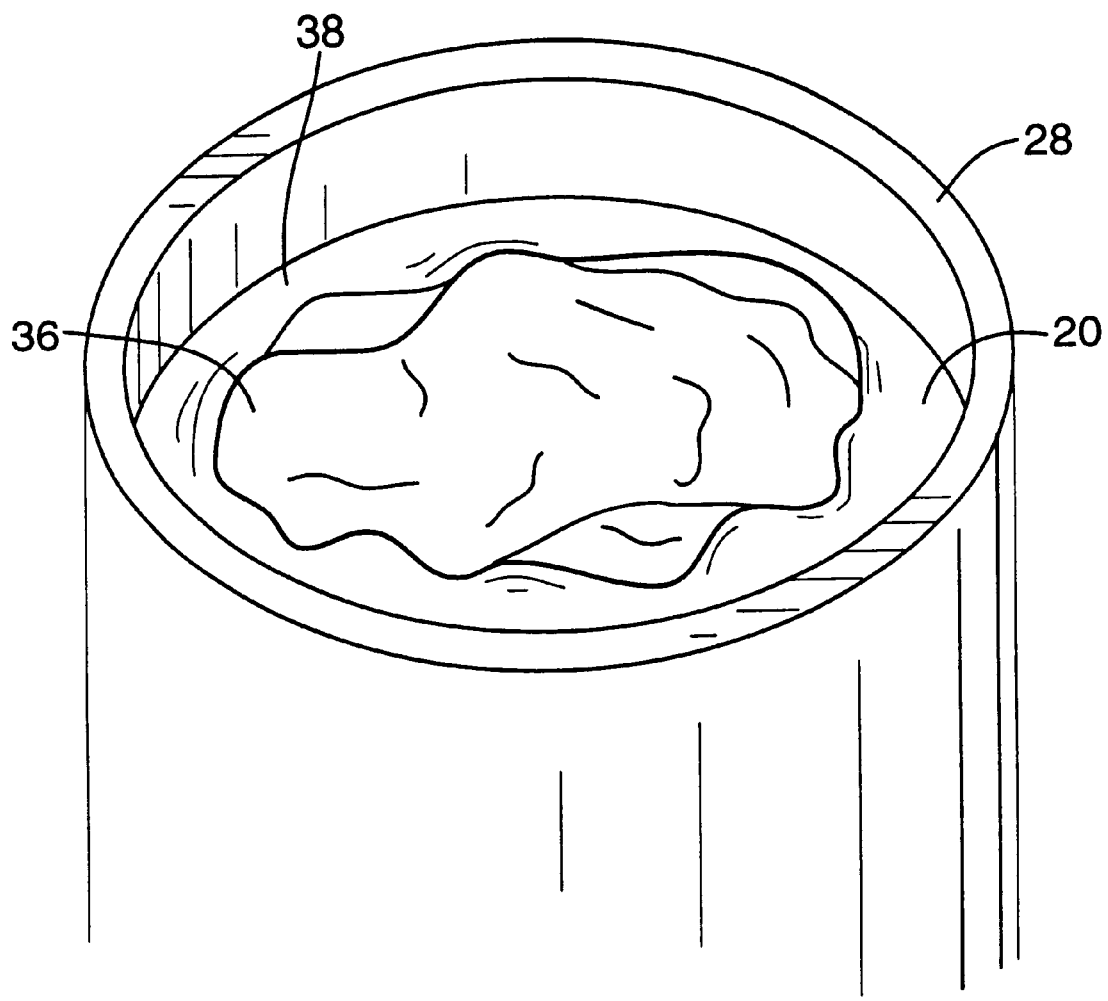
FIG. 2 is a perspective view illustrating the solidified surface of the melt in the crucible of FIG. 1.

As illustrated in FIG. 2 and described by block 46 of FIG. 7a, the temperature of the surface of the melt 20 is then reduced to below the melting point of the melt thereby at least partially solidifying the surface of the melt to form a solidified portion or "ice" 36 on the surface of the melt. For a melt comprised of silicon, the temperature of the surface of the melt is reduced below the melting point of silicon, which is approximately 1412° C. Since most dopants have different melting temperatures than silicon or other host materials, the amount of the temperature reduction necessary to at least partially solidify the surface of the melt may vary depending upon whether dopant is added to the host material, and if so, the specific dopant and the amount of dopant added.

The reduction in the temperature of the surface of the melt 20 can be brought about through a number of alternate means. For example, the temperature can be reduced by lowering the heat energy output of the heaters 24, 34. Alternately, the reduction in temperature can be brought about in other ways, such as by decreasing the pressure inside the crucible, increasing the rotation rate of the crucible, increasing the cooling gas flow rate, and/or increasing the distance of the heaters from the crucible. In each of these cases, the temperature reduction can be accomplished while the seed crystal 10 is positioned over the melt and the temperature of the seed crystal is stabilizing.

While heaters 24, 34 can be controlled such that the entire melt is cooled and solidified, heaters 24, 34 can be separately controlled such that heater 24 radiates less heat while heater 34 continues to radiate as much or more heat, thereby permitting the surface of the melt to cool and solidify while lower portions of the melt remain molten. Alternatively, heater 24 may comprise a number of individually controllable, circumferentially extending heater elements that are spaced axially alongside the crucible such that the heat generated by the various heater elements can be controlled. By controlling the heat output of the various heater elements, the surface of the melt can be solidified while the remainder of the melt remains molten. As a result of only solidifying the surface of the melt, less energy is required to remelt the entire melt, as described hereinafter.

Once the temperature of the melt has been reduced and the surface of the melt is at least partially solidified, the crucible 28 can be recharged with polycrystalline silicon. In this case, the temperature reduction is preferably initiated prior to positioning the seed crystal 10 above the surface of the melt 20. Once the crucible is recharged, the seed crystal can then be lowered to a position spaced from, but near the surface of the melt. The seed crystal is held in this position near the surface of the melt so that the seed crystal warms by thermal convection and radiation to a temperature near the temperature of the surface of the melt.

Figure 3:
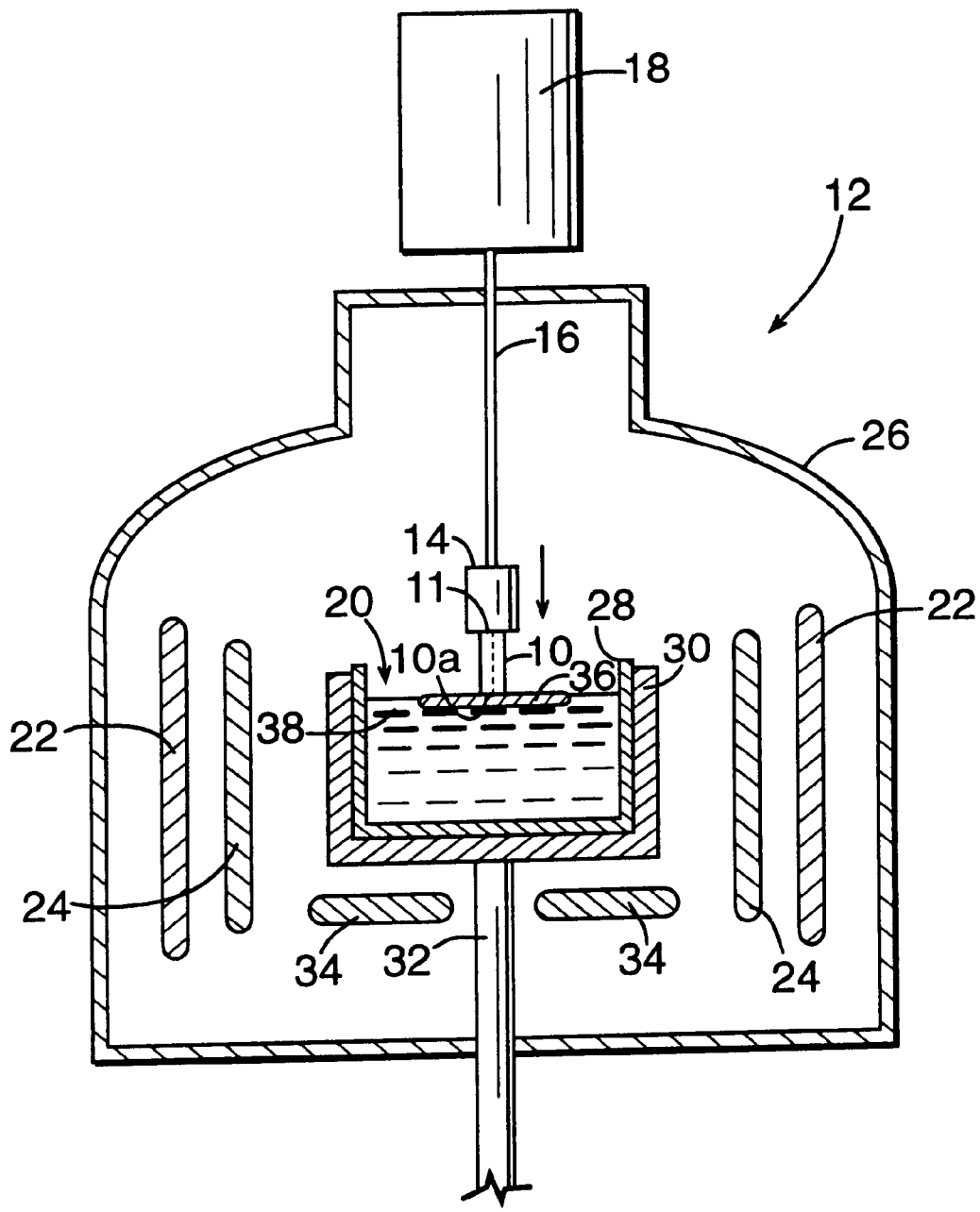
FIG. 3 is a schematic side view of the CZ crystal growing apparatus of FIG. 1 illustrating the seed crystal being brought into contact with the solidified portion of the melt.
Figure 4A:
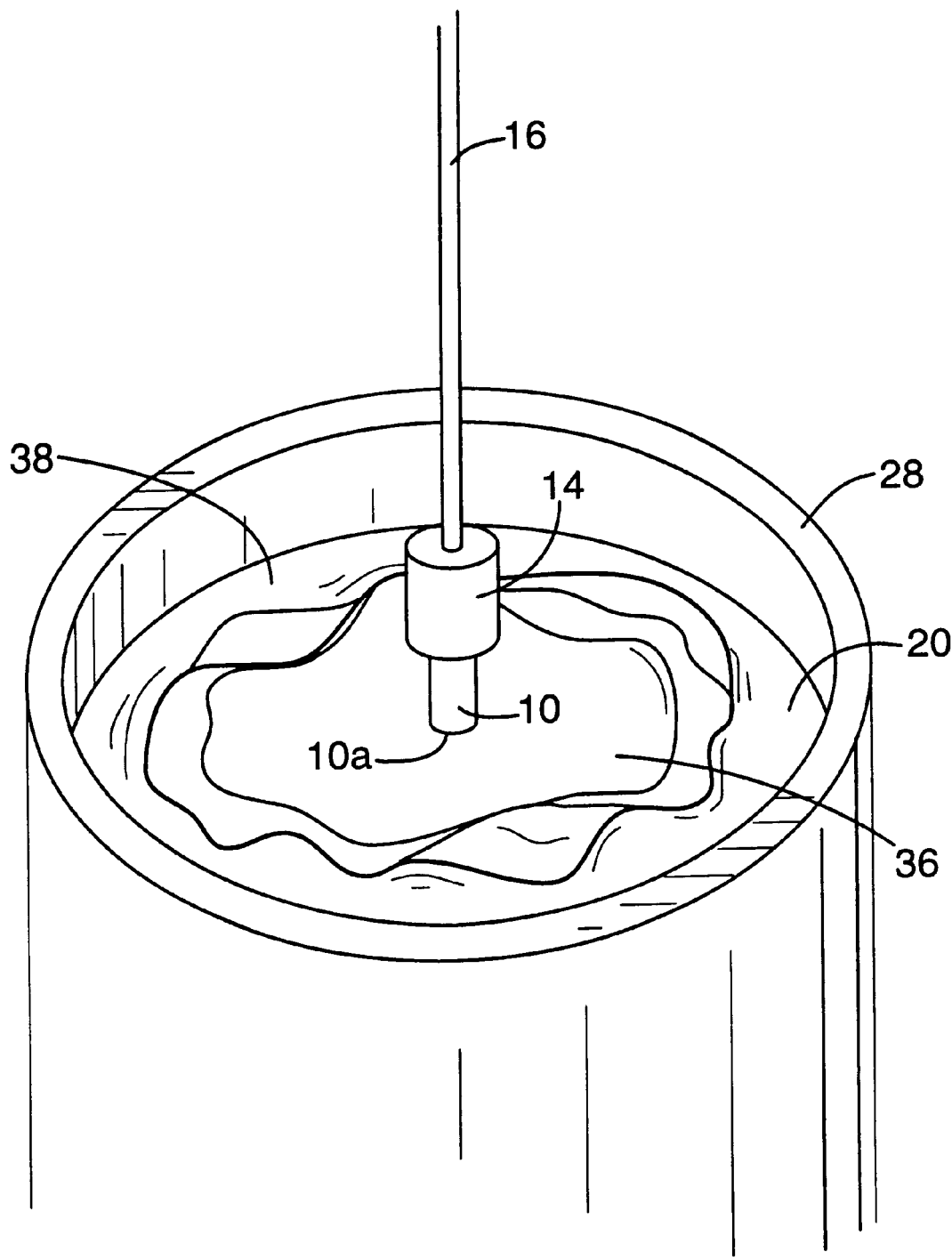
FIGS. 4a–4d are sequential side views illustrating the seed crystal being maintained in contact with the solidified portion of the melt while the melt is gradually liquified.
Figure 4B:
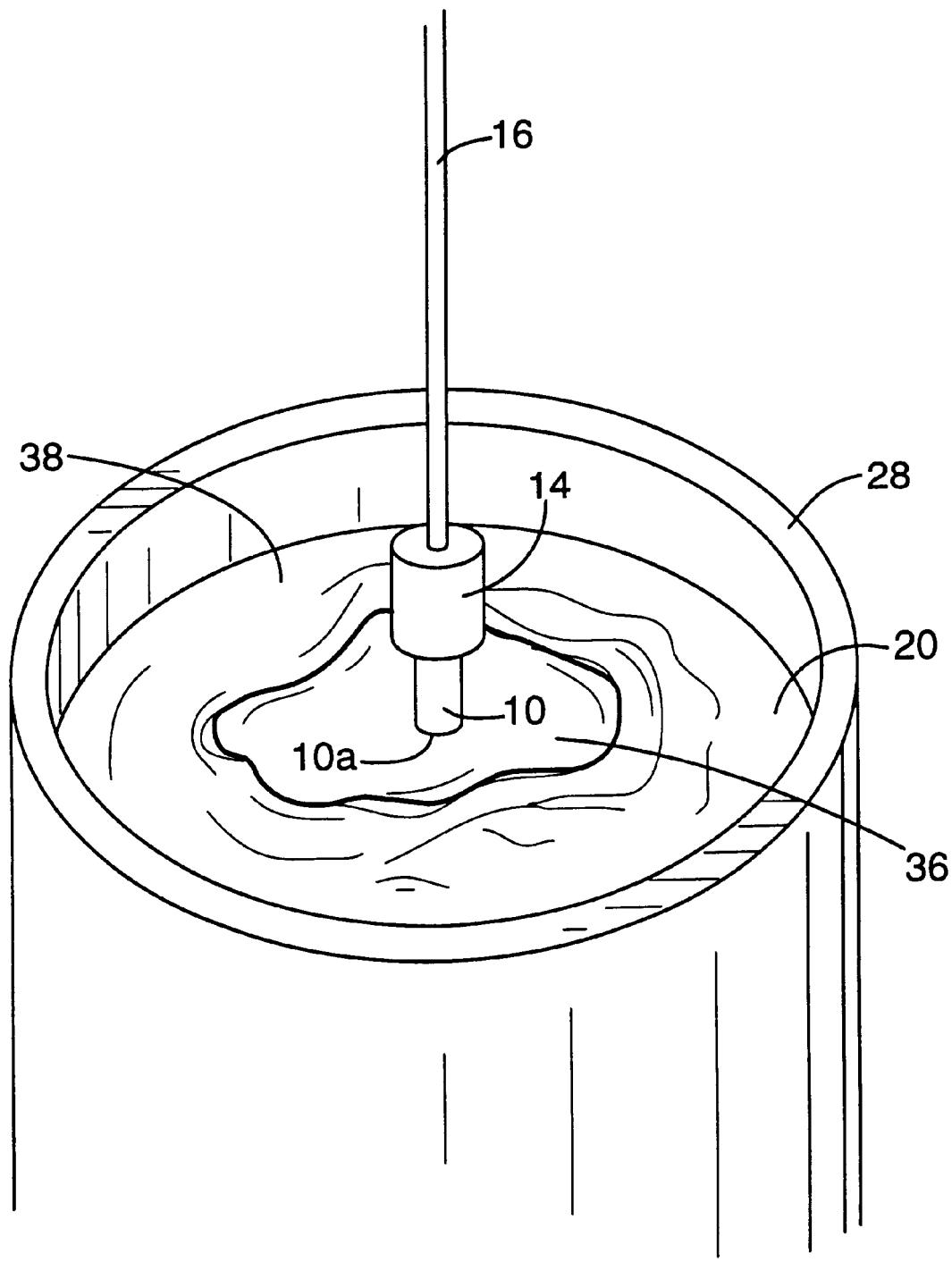
Figure 4C:
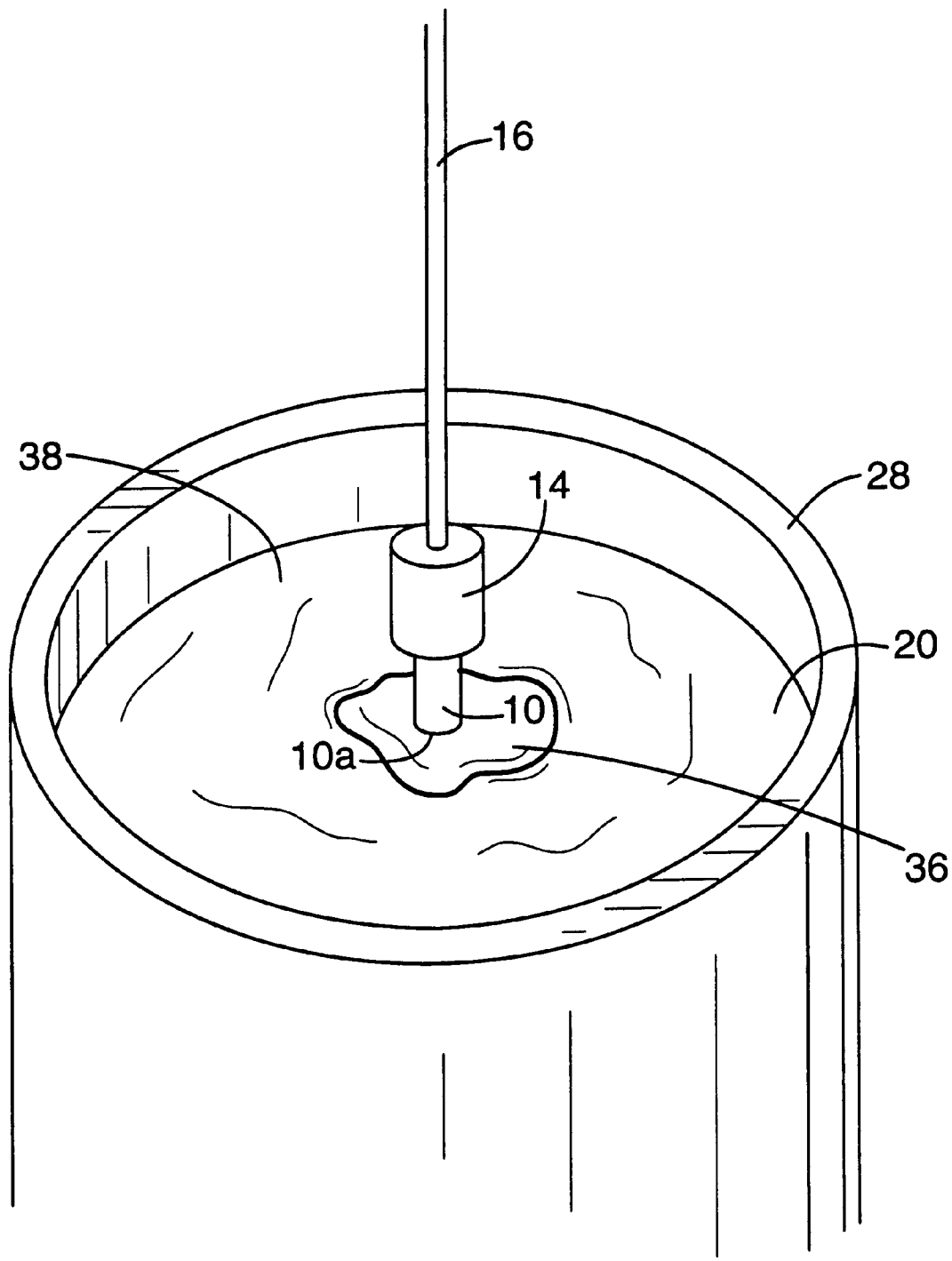
Figure 4D:
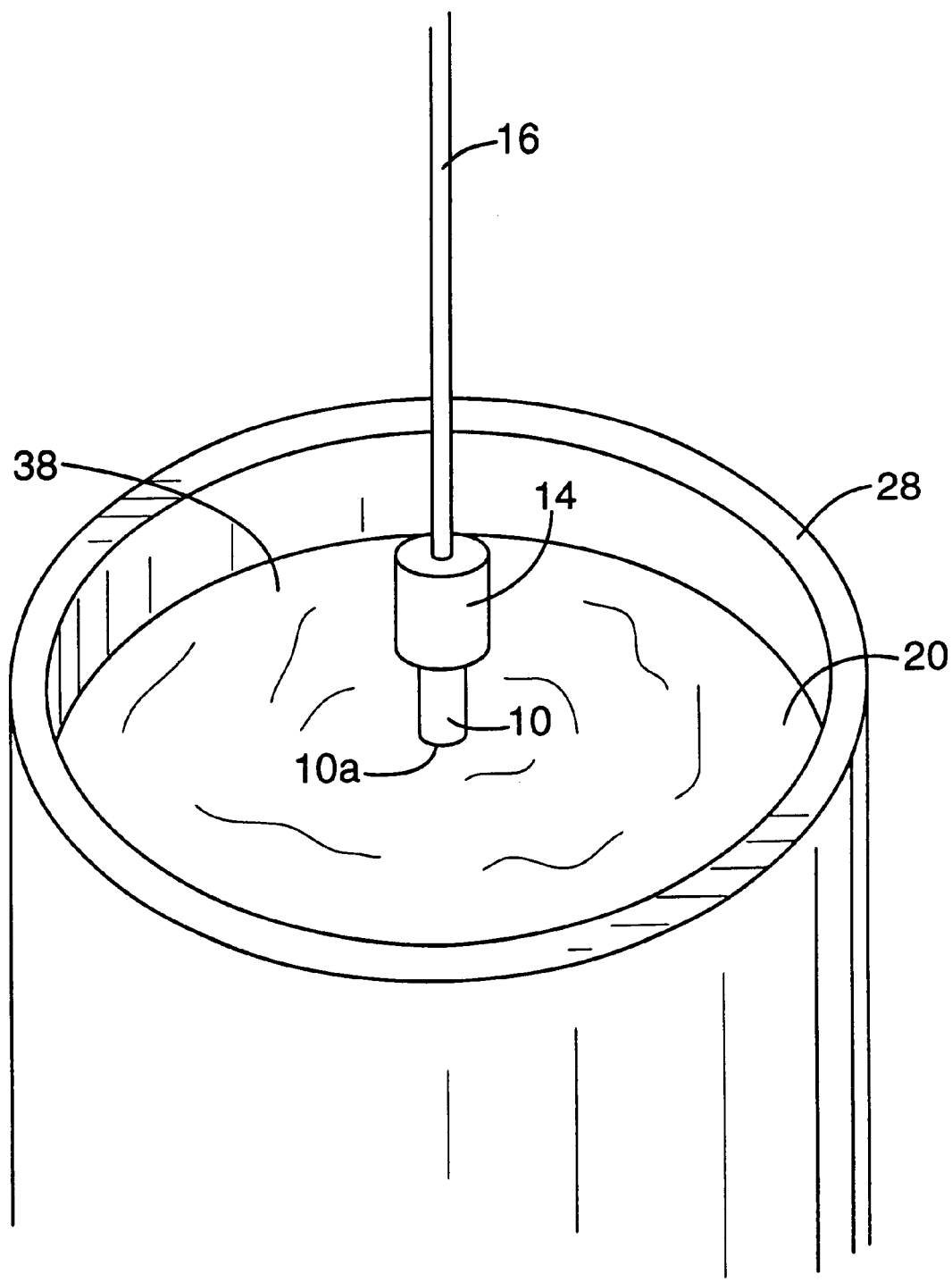

As illustrated in FIG. 3 and as described in block 50 in FIG. 7a, once the seed crystal 10 reaches a stable temperature near the temperature of the solidified portion 36 of the surface of the melt 20, see block 49, the seed crystal is again lowered such that the end 10a, i.e., the bottom surface, of the seed crystal contacts the solidified portion of the surface of the melt. The time necessary for the elongate seed crystal to stabilize is dependent upon a number of factors, for example, the size of the melt, the temperature of the melt, the cooling gas flow rate, the weight of the charge, the location of the heaters, as well as the pressure in the growing apparatus, which is normally maintained below ambient pressure. As the seed crystal contacts the solidified portion of the melt, heat transfer from the surface of the melt to the seed crystal changes from primarily convection to primarily conduction. Preferably, neither the melt nor the seed crystal is rotated while the seed crystal is in contact with the solidified portion of the surface of the melt.

In conventional growing processes, the thermal shock arising from the change in the heat transfer mechanism from convection to conduction results in dislocations being generated in the seed crystal 10. As known to those skilled in the art, a seed crystal having a predetermined orientation defines one or more crystallographic planes along which the dislocations generally propagate. In particular, it is generally understood that the dislocations tend to propagate along the crystallographic plane of the seed crystal that is the most dense, although some dislocations may propagate along other crystallographic planes. For a monocrystalline silicon seed crystal having a <100> orientation, the dislocations generally propagate along the <111> plane that is disposed at an angle of approximately 55° relative to the longitudinal axis 11 defined by the seed crystal.

Advantageously, the at least partial solidification of the surface of the melt 20 decreases the temperature difference between the warm seed crystal and the solidified surface of the melt by creating a temperature difference between the solidified portion 36 of the surface of the melt and the liquified lower portion 38 of the melt. The reduction in the temperature of the surface of the melt relative to the remainder of the melt reduces the thermal shock to the seed crystal, thereby significantly reducing the number of dislocations propagated through the seed crystal 10, if not preventing the propagation of dislocations altogether. As described in block 52 of FIG. 7a, the seed crystal 10 is held in contact with the solidified portion 36 of the surface of the melt 20. Following the initial thermal shock, the temperature of the entire seed crystal 10 quickly stabilizes to a temperature near or at the temperature of the solidified surface portion of the melt so as to prevent any further dislocation generation. As illustrated in FIGS. 4a–4d and as described in block 54 of FIG. 7a, once the temperature of the seed crystal has stabilized as a result of primarily conductive heat transfer with the solidified portion of the surface of the melt, see block 53, the temperature of the melt and specifically, the surface of the melt, is increased to approximately 1412° C. so as to completely liquify the melt.

Figure 7B:
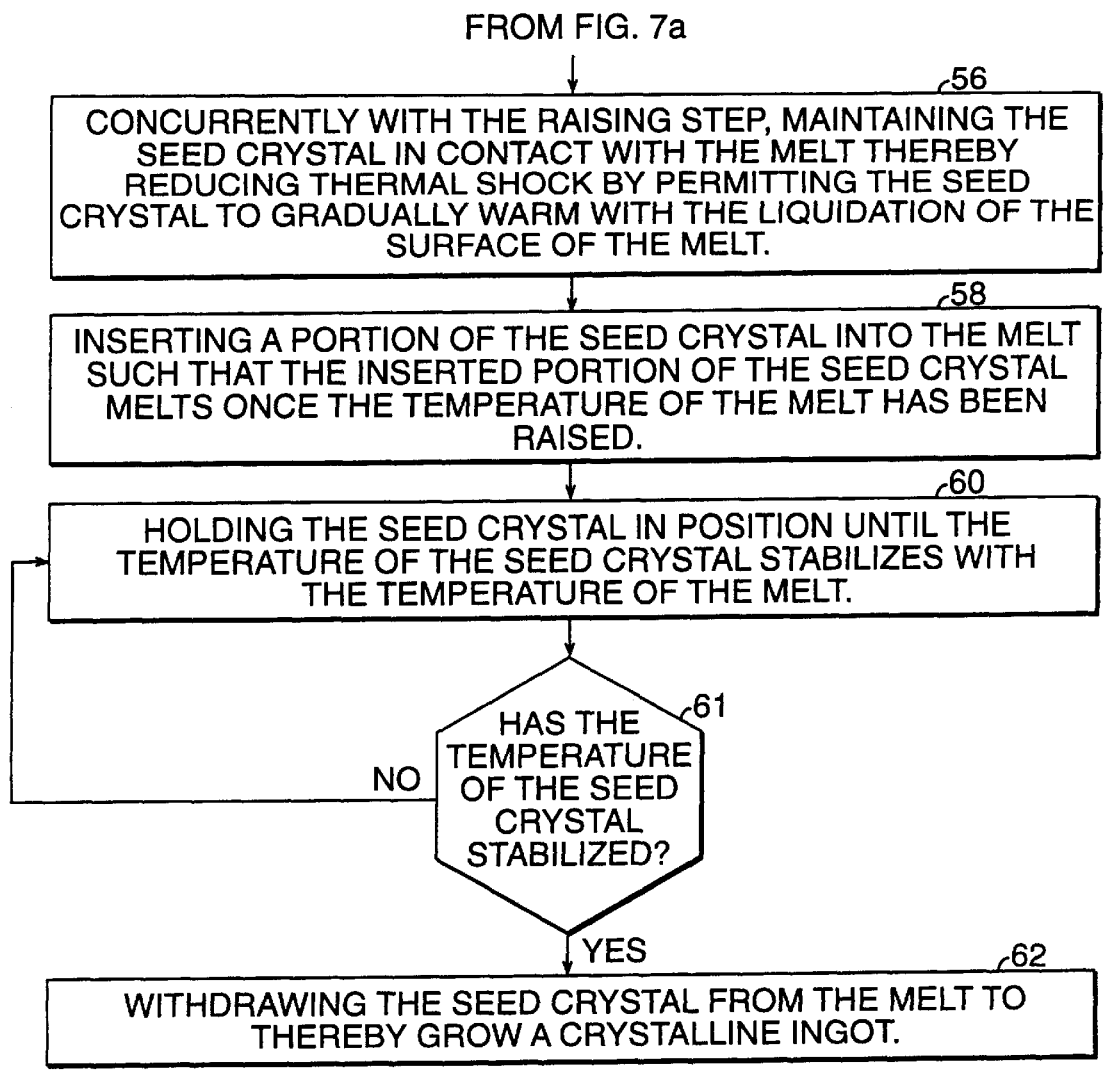
Figure 8A:
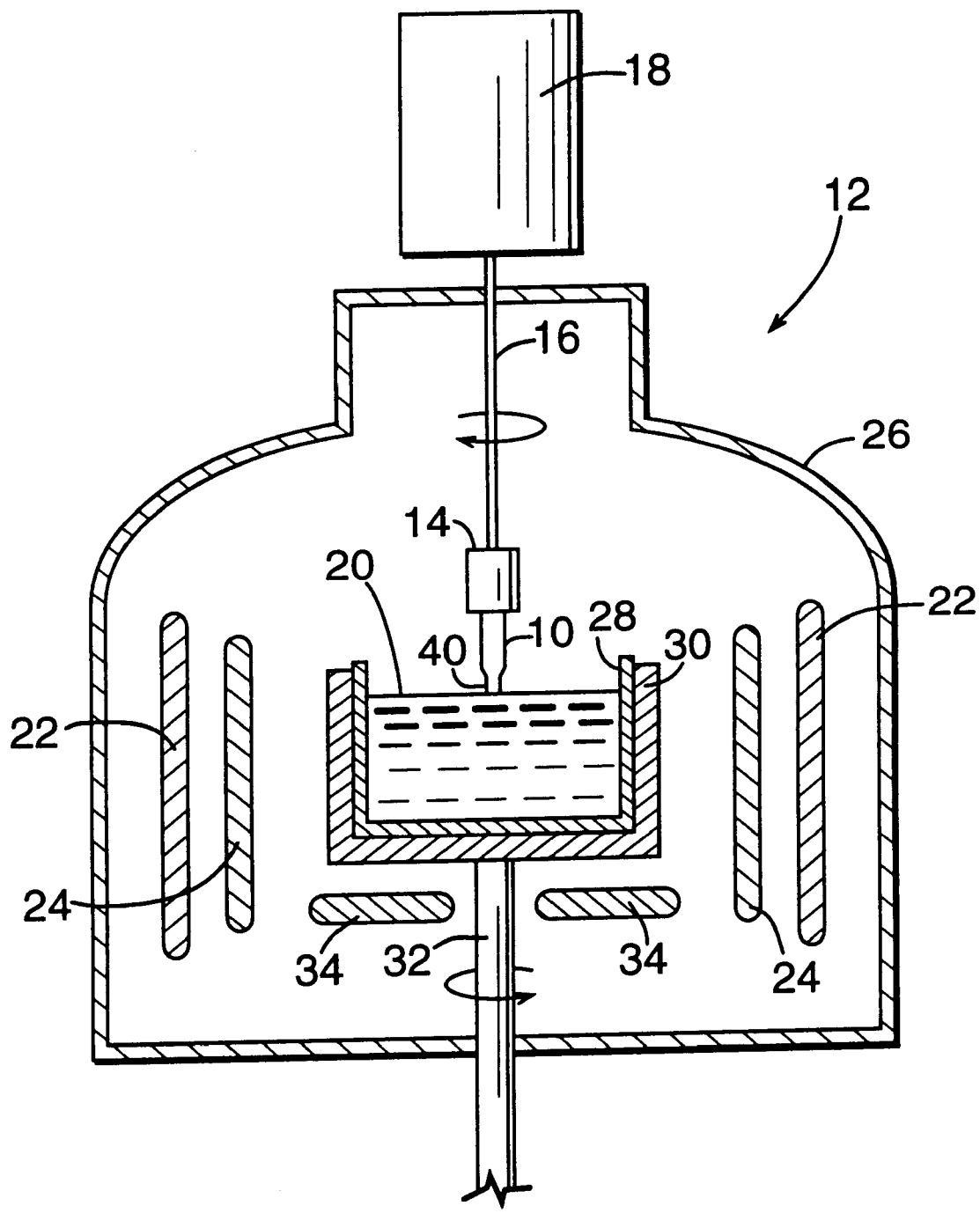
FIGS. 8a–8d are sequential schematic side views illustrating an alternate method of withdrawing the seed crystal from the liquified melt to thereby grow a DF crystalline ingot.
Figure 8B:
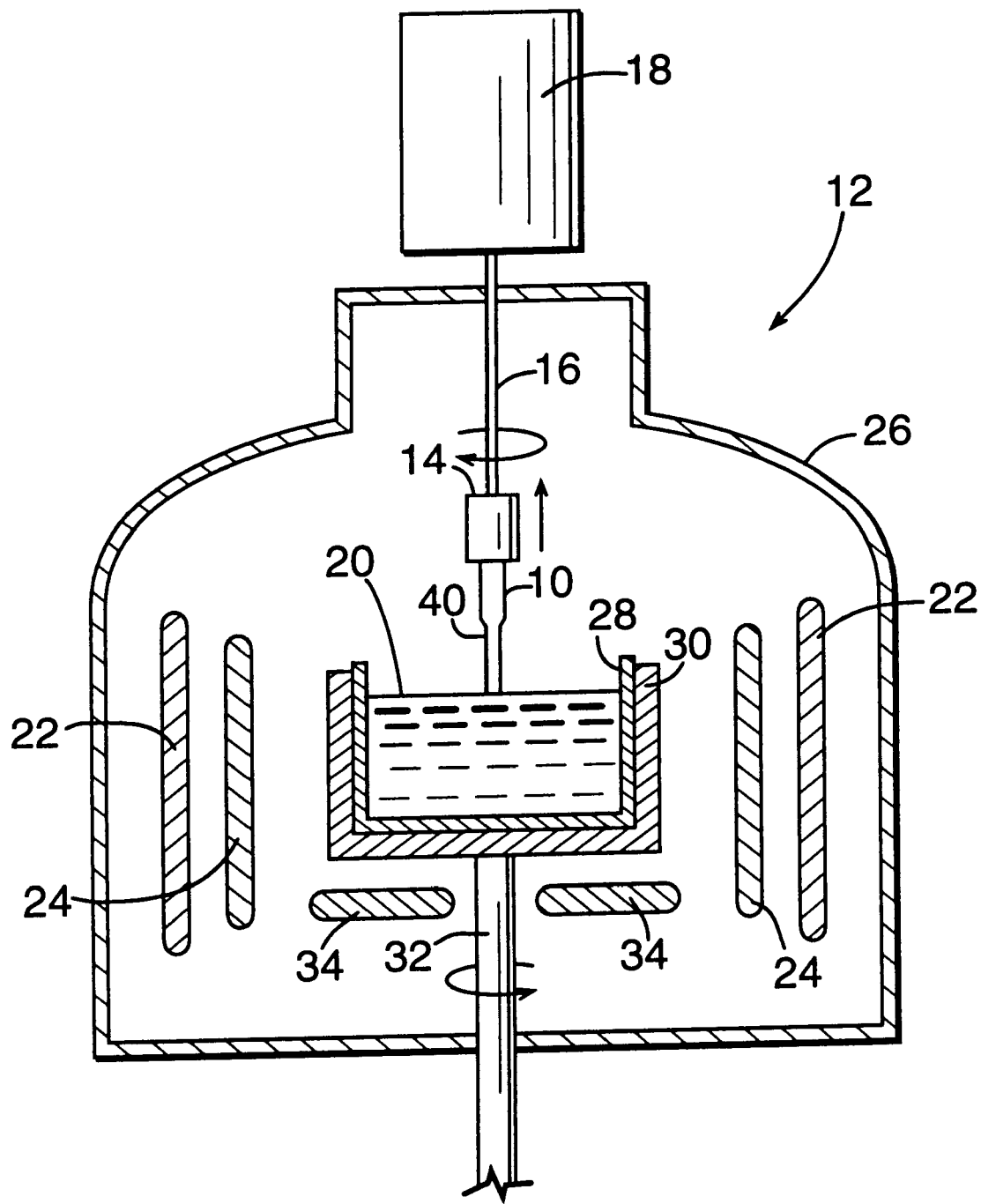
Figure 8C:
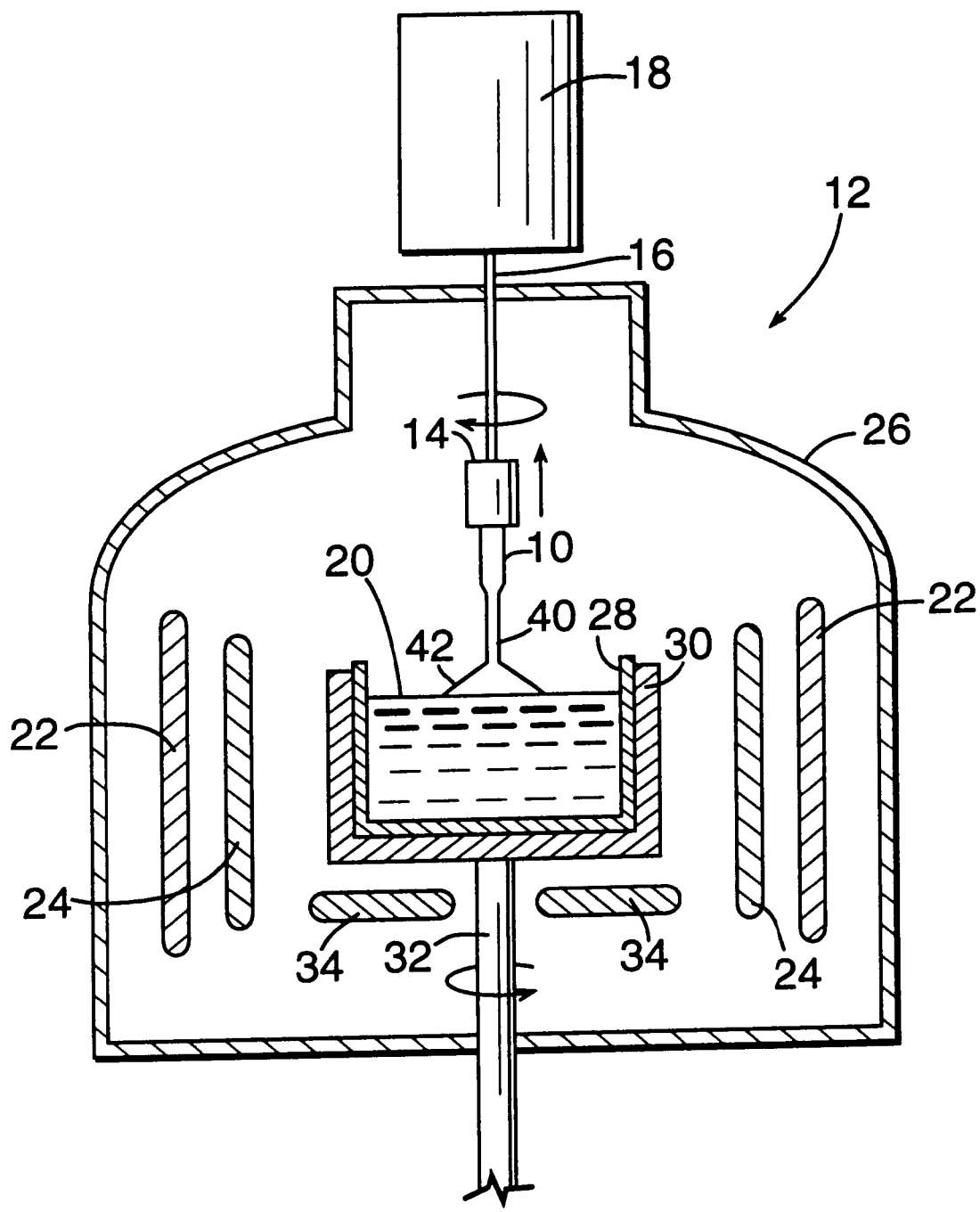
Figure 8D:
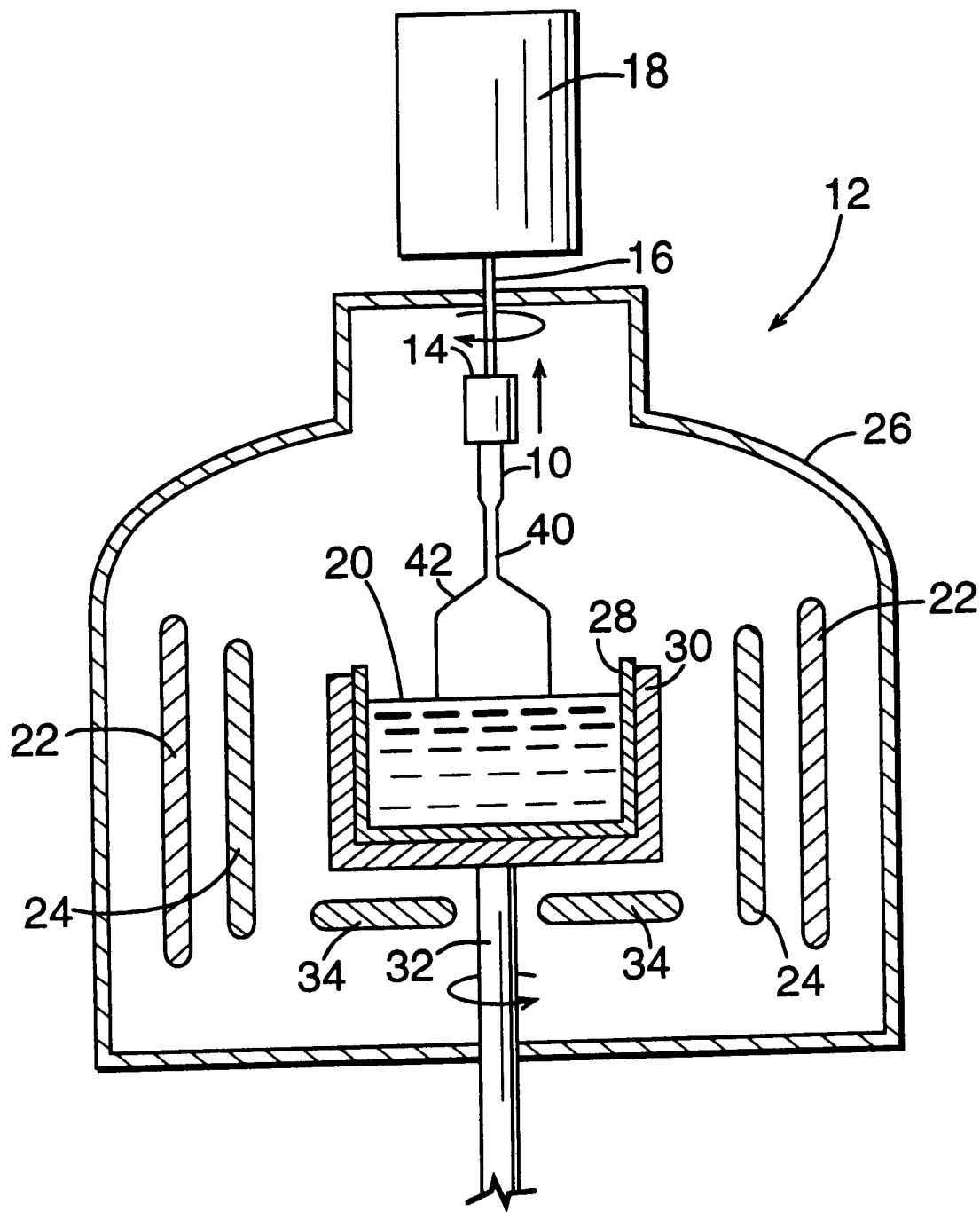

As illustrated in FIGS. 4a–4d and as described in block 56 of FIG. 7b, while the melt 20 is being liquified, the bottom end 10a of the seed crystal 10 is maintained in contact with the solidified portion 36 of the surface of the melt to thereby reduce any thermal shock to the seed crystal by permitting the seed crystal to gradually warm with the liquidation of the surface of the melt. Maintaining the bottom end of the seed crystal in contact with the solidified portion of the surface of the melt and subsequently, the liquidous surface 38 of the melt is quite important as there is an appreciable temperature gradient between the surface of the melt and the space directly above the surface of the melt. Advantageously, the liquidation of the melt will gradually raise the temperature of the seed crystal thereby avoiding thermal shock of the seed crystal and further propagation of dislocations in the seed crystal. Once the liquidation of the melt is complete, the seed crystal will be stable near the temperature of the surface of the melt. Preferably, once the solidified portion of the melt has been completely liquified, the seed crystal and the melt are again rotated in opposite directions.

Figure 5:
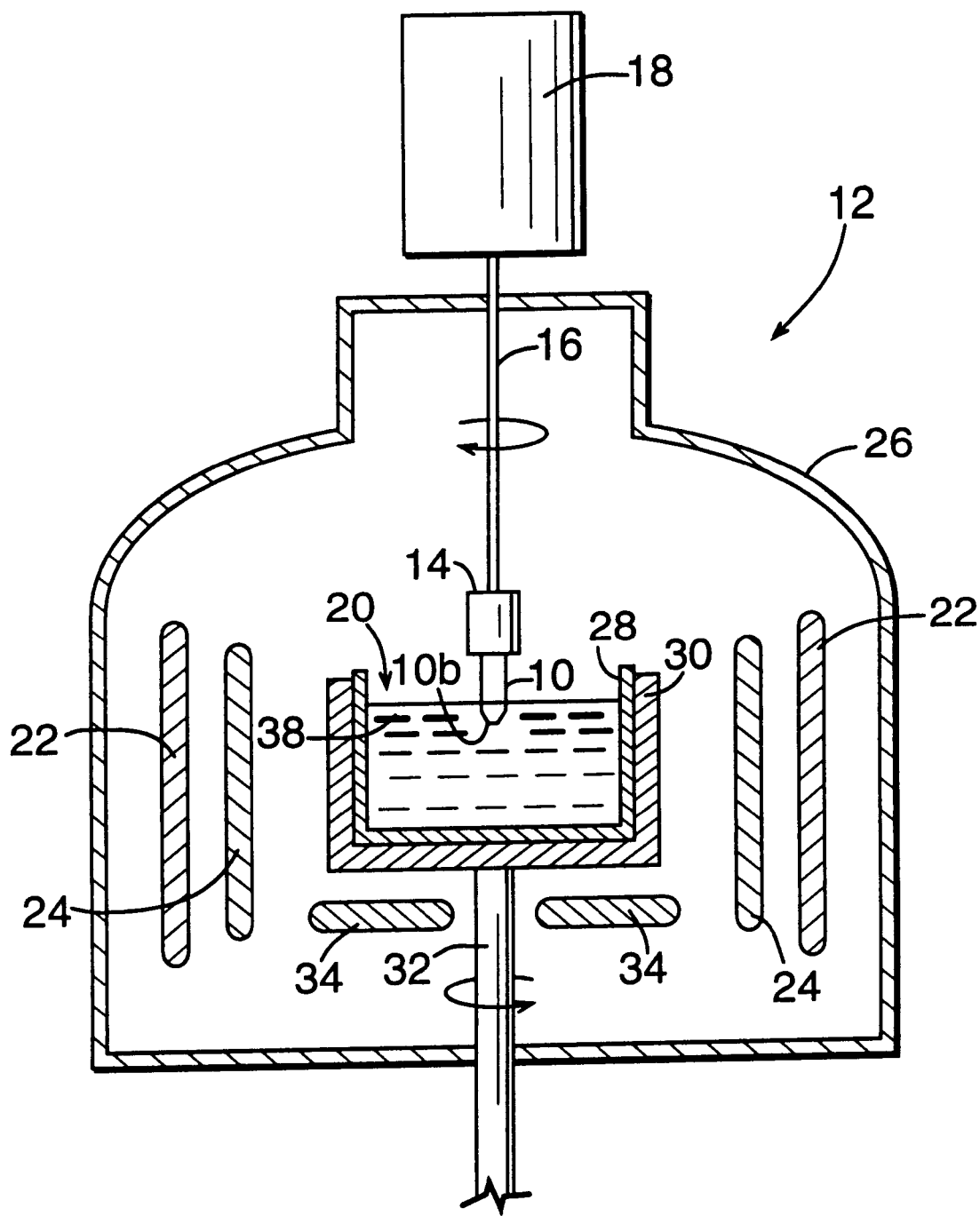
FIG. 5 is a schematic side view illustrating the seed crystal being inserted or dipped into the liquified melt.

As described in block 58 of FIG. 7b and as illustrated in FIG. 5, once the temperature of the seed crystal 10 has stabilized as a result of primarily conductive heat transfer with the solidified portion 36 of the surface of the melt 20 and upon its liquidation, the liquidous surface 38 of the melt, the bottom end 10a of the seed crystal may be further lowered and inserted into the melt. Since the propagation of dislocations in the seed crystal is significantly reduced, if not eliminated entirely, as a result of the reduced temperature gradient between the seed crystal and the solidified portion of the surface of the melt, as well as the gradual warming of the seed crystal as the solidified portion of the surface of the melt is liquified, the dislocations within the seed crystal are near the bottom and such that the portion of the seed crystal dipped into the melt will contain most, if not all, of the dislocations in the seed crystal. As shown in FIG. 5, the end of the seed crystal is inserted into the melt such that the entire dip portion 10b of the seed crystal and all the dislocations contained therein are liquified into the melt, becoming part of the molten bath. As an example, and not for purposes of limitation, the dip portion of the seed crystal preferably ranges in length from about 1 mm to 10 mm, although other lengths, greater or smaller, are considered to be well within the scope and spirit of the present invention. Once again, the seed crystal is then held in position until the temperature of the seed crystal stabilizes, as described in block 60 of FIG. 7b. Since all of the dislocations generated upon initial contact of the end 10a of the seed crystal with the melt are confined to the dislocation region of the dip portion, most, if not all, parts of the seed crystal that include dislocations are melted and the remaining portion of the seed crystal is substantially dislocation free.

Figure 6A:
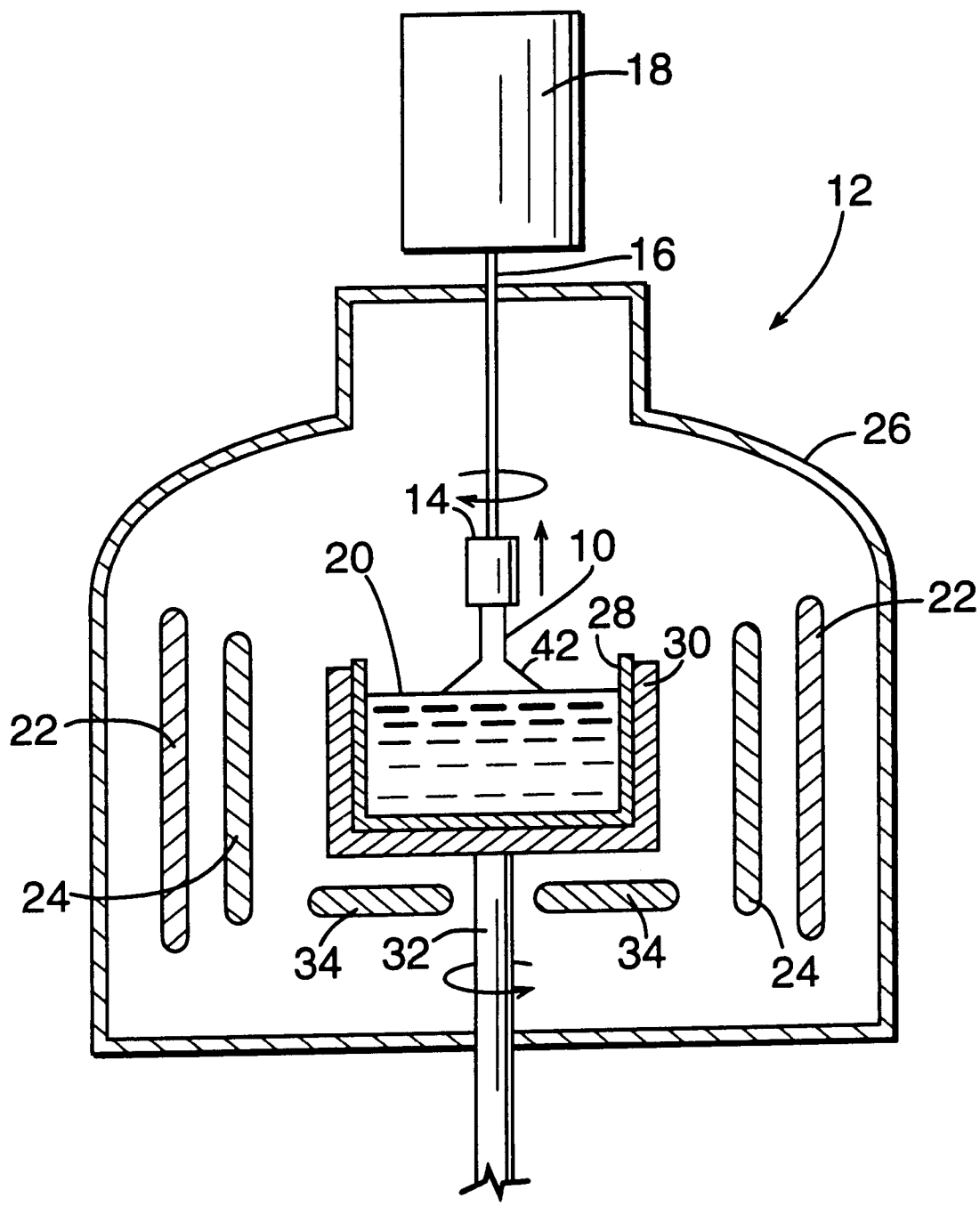
FIGS. 6a–6b are sequential schematic side views illustrating the seed crystal being withdrawn from the liquified melt to thereby grow a DF crystalline ingot.
Figure 6B:
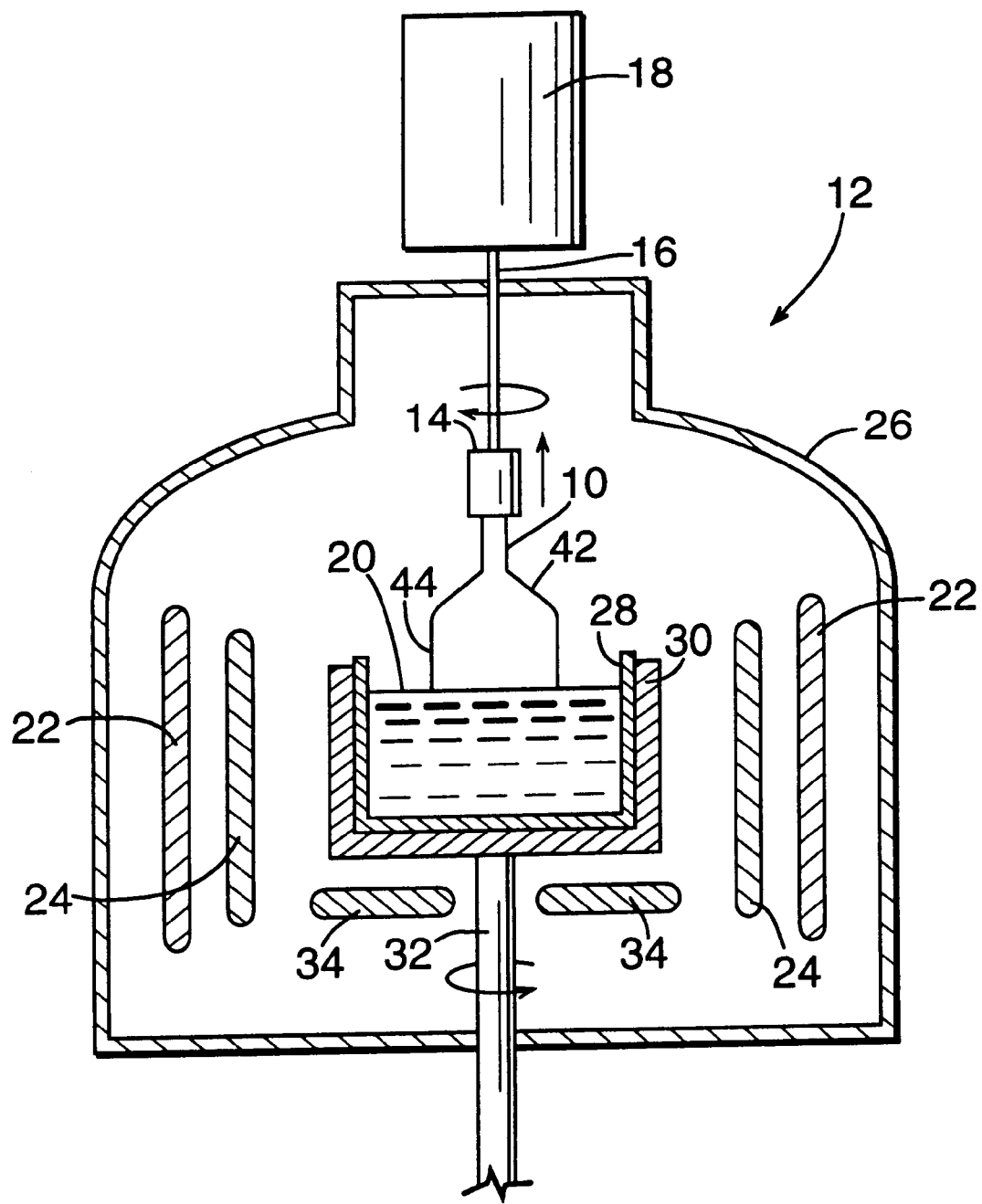

As illustrated in FIGS. 6a–6b and as described in block 62 of FIG. 7b, once the temperature of the seed crystal 10 has stabilized, see block 61, and the dip portion 10b of the seed crystal has melted, the seed crystal is gradually withdrawn from the melt 20 and a crystalline ingot is thereby grown according to conventional CZ crystal growing techniques. As known to those skilled in the art, a seed crystal is withdrawn from a melt by gradually lifting the seed crystal from the surface of the melt. As the seed crystal is withdrawn, however, the seed crystal remains in contact with the melt during the formation of the shoulder 42 and the main body 44 of the crystal. As is also known to those skilled in the art, the melt and the seed crystal are generally rotated in opposite directions as the seed crystal is withdrawn from the melt to further improve the properties of the resulting crystal. Since the portion of the seed crystal 10 remaining following the insertion of the dip portion 10b into the melt 20 is dislocation free, a neck need not be grown immediately adjacent to the seed crystal prior to growing the main body 44 of the crystal, as discussed above in conjunction with the Dash method. Instead, the shoulder 42 and the main body of the crystal can be grown from the seed crystal such that the shoulder and the main body of the crystal are immediately adjacent to the seed crystal, as shown in FIG. 6b. By eliminating the requirement for a neck, the seed crystal and the associated fabrication method of the present invention can fabricate a DF crystalline ingot having a relatively large diameter, such as 300 mm or greater, and a relatively large mass, such as 300 kg, 400 kg or more, without requiring specialized lifting or support devices. Further, since the neck need no longer be grown prior to growing the main body of the crystal, the fabrication process is greatly simplified and the amount of material waste is appreciably reduced.

Even though a neck is not required to eliminate dislocations, a neck 40 may still be grown between the seed crystal 10 and the shoulder 42 and main body 44 of the seed crystal, if so desired, as shown in FIGS. 8a–8d. Advantageously, according to the method of the present invention, the neck need not have the relatively small diameter and long length as described above in conjunction with the Dash method. Instead, the neck can have a much larger diameter and can be much shorter, since the portion of the seed crystal 10 remaining following the insertion of the dip portion 10b into the melt 20 is substantially dislocation free such that the neck portion need not be designed to specifically eliminate dislocations.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method of growing a crystalline ingot, comprising the steps of:
    reducing the temperature of a melt to solidify at least a portion of the surface of the melt;
    thereafter, contacting the seed crystal with the solidified portion of the surface of the melt;
    holding the seed crystal in contact with the solidified portion of the melt until the temperature of the seed crystal stabilizes;
    raising the temperature of the melt to completely liquefy the melt once the temperature of the seed crystal has stabilized;
    maintaining the seed crystal in contact with the melt thereby reducing thermal shock by permitting the seed crystal to gradually warm with the liquidation of the melt;
    inserting a portion of the seed crystal into the melt such that the inserted portion of the seed crystal melts once the temperature of the melt has been raised; and
    withdrawing the seed crystal from the melt to thereby grow the crystalline ingot.

2. A method according to claim 1 wherein said maintaining step is carried out concurrently with said raising step.

3. A method according to claim 1 wherein said reducing step comprises reducing the temperature of the melt such that the melt includes a solid portion and a molten liquidous portion.

4. A method according to claim 1 wherein the crystalline ingot includes a shoulder and a main body, and wherein said withdrawing step comprises growing the shoulder and the main body of the crystalline ingot adjacent the seed crystal such that the crystalline ingot is free of a neck.

5. A method according to claim 1 wherein said withdrawing step includes growing a neck adjacent the seed crystal.

6. A method according to claim 1 further comprising the step of positioning the seed crystal near the melt to thereby raise the temperature of the seed crystal prior to said contacting step.

7. A method according to claim 1 wherein said step of holding the seed crystal in contact with the solidified portion of the melt comprises the step of reducing thermal shock by permitting the seed crystal to gradually warm upon contact with the solidified portion of the melt.

8. A method according to claim 1 further comprising the step of holding the seed crystal in contact with the melt following said inserting step until the temperature of the seed crystal stabilizes.

9. A method according to claim 1 wherein said inserting step comprises inserting a portion of the seed crystal about 1 mm to 10 mm in length.

10. A method according to claim 1 further comprising the step of providing a seed crystal about 100 mm to 120 mm in length prior to said contacting step.

11. A method according to claim 1 further comprising the step of providing a seed crystal about 15 mm in width prior to said contacting step.

12. A method of growing a crystalline ingot, comprising the steps of:
    providing a melt having an at least partially solidified surface;
    contacting the seed crystal with the solidified portion of the surface of the melt;
    permitting the temperature of the seed crystal to stabilize to a temperature near the temperature of the solidified portion of the surface of the melt;

raising the temperature of the melt to liquify the solidified portion of the surface of the melt once the temperature of the seed crystal has stabilized;

concurrently with said raising step, maintaining the seed crystal in contact with the melt thereby reducing thermal shock by permitting the seed crystal to gradually warm with the liquidation of the melt; and thereafter raising the seed crystal from the melt to thereby grow the crystalline ingot.

13. A method according to claim 12 further comprising inserting a portion of the seed crystal into the melt after said maintaining step such that the inserted portion of the seed crystal melts.

14. A method according to claim 13 further comprising the step of holding the seed crystal in contact with the melt following said inserting step until the temperature of the seed crystal stabilizes.

15. A method according to claim 13 wherein said inserting step comprises inserting a portion of the seed crystal about 1 mm to 10 mm in length.

16. A method according to claim 12 wherein said providing step comprises providing a melt such that the melt includes a solid surface portion and a molten liquidous portion.

17. A method according to claim 12 wherein the crystalline ingot includes a shoulder and a main body, and wherein said crystal raising step comprises growing the shoulder and the main body of the crystalline ingot adjacent the seed crystal such that the crystalline ingot is free of a neck.

18. A method according to claim 12 wherein said crystal raising step includes growing a neck between the seed crystal and the crystalline ingot.

19. A method according to claim 12 further comprising the step of positioning the seed crystal near the melt to thereby raise the temperature of the seed crystal prior to said contacting step.

20. A method according to claim 12 wherein said step of permitting the temperature of the seed crystal to stabilize comprises the step of reducing thermal shock by permitting the seed crystal to gradually warm upon contact with the solidified portion of the melt.

21. A method according to claim 12 further comprising the step of providing a seed crystal about 100 mm to 120 mm in length prior to said contacting step.

22. A method according to claim 12 further comprising the step of providing a seed crystal about 15 mm in width prior to said contacting step.

* * * * *

UNITED STATES PATENT AND TRADEMARK OFFICE
CERTIFICATE OF CORRECTION

PATENT NO. : 6,090,198
DATED : July 18, 2000
INVENTOR(S) : Aydelott

It is certified that error appears in the above-identified patent and that said Letters Patent is hereby corrected as shown below:

Title page, [56] References Cited, OTHER PUBLICATIONS, page 2, column 2, line 5, "Gzochealski" should read --Czochralski--; line 6, "Dissue" should read --Diffuse--.

Signed and Sealed this

Seventeenth Day of April, 2001

Attest:

NICHOLAS P. GODICI

Attesting Officer

Acting Director of the United States Patent and Trademark Office